US006445330B1

United States Patent
Thomsen et al.

(10) Patent No.: US 6,445,330 B1
(45) Date of Patent: Sep. 3, 2002

(54) CAPACITIVELY COUPLED REFERENCES FOR ISOLATED ANALOG-TO-DIGITAL CONVERTER SYSTEMS

(75) Inventors: Axel Thomsen, Austin, TX (US); Qicheng Yu, Nashua, NH (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 09/834,630

(22) Filed: Apr. 16, 2001

(51) Int. Cl.[7] .................................................. H03M 1/12
(52) U.S. Cl. ............................................. 341/172; 341/120
(58) Field of Search ..................................... 341/172, 139, 341/143, 144, 166, 162, 165

(56) References Cited

U.S. PATENT DOCUMENTS

| | | | | |
|---|---|---|---|---|
| 5,016,014 A | * | 5/1991 | Bitting | 341/162 |
| 5,030,954 A | * | 7/1991 | Ribner | 341/172 |
| 6,087,970 A | * | 7/2000 | Panicacci | 341/172 |
| 6,104,794 A | * | 8/2000 | Hein et al. | 379/142 |
| 6,208,685 B1 | * | 3/2001 | Yamazaki | 375/152 |
| 6,262,921 B1 | * | 7/2001 | Manning | 365/194 |
| 6,288,661 B1 | * | 9/2001 | Holberg | 341/145 |

* cited by examiner

Primary Examiner—Peguy JeanPierre
Assistant Examiner—Joseph J. Lauture
(74) Attorney, Agent, or Firm—Robert P. Bell; Steven Lin

(57) ABSTRACT

The present invention provides an alternative to Prior Art isolation techniques by providing a capacitively coupled reference voltage and a capacitively coupled gain calibration. The isolation technique of the present invention is based upon the idea of a near unity gain capacitive divider. If the load or parasitic capacitance is Cload and the isolation capacitance is Ciso, then the gain between input and output can be calculated as Vout/Vin=(Ciso)/(Ciso+Cload), which will be nearly unity (i.e., 1) when Ciso>>Cload. In addition, if Ciso>>Cload, the gain will also be largely insensitive to variations in Ciso and Cload. For example, if Cin is 100 ppm of Ciso, then a 10% variation in Ciso or Cload results in only a 10 ppm variation in the voltage gain.

14 Claims, 4 Drawing Sheets

CAPACITIVELY COUPLED REFERENCES FOR ISOLATED ANALOG-TO-DIGITAL CONVERTER SYSTEMS

CROSS-REFERENCE TO RELATED APPLICATIONS

The subject matter of the present application is related to that in co-pending U.S. patent application Ser. No. 09/690,981, filed Oct. 18, 2000, entitled "FULL DUPLEX COMMUNICATION CHANNELS FOR ISOLATED ANALOG-TO-DIGITAL CONVERTER SYSTEMS", incorporated herein by reference, and co-pending U.S. patent application Ser. No. 09/902,712, entitled "SYSTEMS AND METHOD FOR CALIBRATING ISOLATED ANALOG-TO-DIGITAL CONVERTERS".

FIELD OF THE INVENTION

The present invention relates to isolation method for analog-to-digital converter systems, and more particularly a method and apparatus for isolating an ADC using a capacitive isolation system.

BACKGROUND OF THE INVENTION

FIG. 1 is a block diagram of a measurement system 9 of the Prior Art. Such measurement systems may be used to measure various analog parameters in environments where voltage isolation is required. For example, in power monitoring systems (e.g., residential power metering) a measurement device (front end) may be measuring power at line voltage (e.g.,220 Volts) and some form of isolation may be required to protect the user and processor (back end) which may be at a much lower potential. Similarly, in medical systems, voltage isolation may be required as a fail-safe to prevent a patient from being electrocuted due to potential differences between various medical monitoring devices.

Referring to FIG. 1, measurement system 9 may include a digital signal processor (DSP) 11, link chip 12, capacitor C1 13, analog-to-digital converter (ADC) and link chip 15, and a sensor 16. Sensor 16 may comprise any one of a number of known analog sensors for measuring a particular parameter (e.g., temperature, pressure, voltage, amperage, power consumption, or the like).

Analog-to-digital converter (ADC) and link chip 15 may convert the analog output of sensor 16 to a digital value (typically a one-bit data stream) and outputs this data stream to a digital signal processor (DSP) 11 via link chip 12 and isolation capacitor 13. In addition to digital data values transmitted from analog-to-digital converter (ADC) and link chip 15 to digital signal processor (DSP) 11, other signals may need to be exchanged between the two chips.

For example, clock signals and control signals (including calibration signals or voltage levels) may be transmitted from digital signal processor (DSP) 11 to analog-to-digital converter (ADC) through link chip 15. In addition, digital signal processor (DSP) 11 may need to provide power supply voltage to analog-to-digital converter through link chip 15. In the Prior Art, additional signal lines may be required for such additional signals, increasing the complexity and cost of the device.

As noted above, in many applications, such as power metering, it may be necessary to isolate analog-to-digital converter (ADC) from link chip 15 and digital signal processor (DSP) 11 due to differences in voltage potential. To isolate the voltage potential between analog-to-digital converter and link chip 15 and digital signal processor (DSP) 11, an isolation capacitor 13 may be employed.

Such isolation practices, however, may create problems when attempting to communicate from digital signal processor (DSP) 11 and link chip 15 an analog-to-digital converter (ADC) and vice versa. With a small capacitance value C1 for capacitor 13, the use of a digital tri-state gate in link chip 12 and link chip portion of analog-to-digital converter (ADC) and link chip 15 for transmitting data is disadvantageous due to voltage division losses. Nevertheless, using a digital tri-state gate is advantageous for transmitter energy, clock, and command sources, as well as for receiver systems. However, when a transmitter produces a square wave according to a Manchester encoded clock and control scheme, for example, isolation capacitor 13 may block the square wave from the transmitting transformer.

FIG. 2 is a block diagram of another embodiment of a measurement system 19 of the Prior Art. Measurement system 19 includes a digital application specific integrated circuit (ASIC) or programmable logic device (PLD) 21 such as a digital signal processor and link chip, a resistor 22, capacitor 23, transformer 24, analog-to-digital converter (ADC) 25 and capacitor 26.

ASIC or PLD 21 may include a transmitter 27 and receiver 29 coupled to each other through switch 28. Data may be selectively transmitted and received over the connection between ASIC or PLD 21 and ADC 25. In addition, ASIC or PLD 21 may provide power to ADC 25 through this same link.

ADC 25 may include a diode 30 and a rectifier 31. Signals from secondary winding 33 of transformer 24 may be rectified by rectifier 31 and diode 30 to produce a voltage a capacitor 26 which in turn is the power supply for ADC 25.

As in the embodiment of FIG. 1, transmitter 27 may transmit to primary winding 32 of transformer 24 a square wave which may be partially blocked or distorted by capacitor 23 from transformer 24. ADC 25 may detect a pause during the tri-state operation and takes over the data link, sending data and status back to receiver 29. During this take-over period, however, voltage at power supply 26 may droop significantly if many bits are transmitted, and full logic levels may not re-establish themselves.

In addition, an isolated ADC may require an accurate low noise reference voltage from, for example, a microcontroller. If the ADC is rendered in CMOS, a superquality voltage reference may be required for the ADC to accurately measure analog values. CMOS circuitry may be more susceptible to drift due to temperature variations and the like, as well as initial accuracy of measurement.

Further, in order to perform an absolute accurate conversion with an isolated ADC, it may be necessary to send an accurate low noise reference voltage across the isolation barrier. If the ADC is rendered in CMOS, a superquality voltage reference may be required for the ADC to accurately measure analog values. CMOS circuitry may be more susceptible to drift due to temperature variations and the like, as well as initial accuracy of measurement. A better reference, therefore, may be implemented on the isolated side.

Moreover, in some applications, it may be necessary to provide multiple isolated ADCs with precision matched gains for acquiring related signals such that conversion data are known to be exactly at the same scale. These may be ratiometric measurements between several isolated points. Prior art techniques may use separate chips for each ADC side to provide a reference signal. However, such a solution creates extra cost and increases complexity and size of the overall circuitry.

SUMMARY OF THE INVENTION

The present invention provides an alternative to Prior Art isolation techniques by providing a capacitively coupled reference voltage and a capacitively coupled gain calibration. The isolation technique of the present invention is based upon the idea of a capacitive divider. In a preferred embodiment, the capacitive divider may comprise a near unity gain capacitive divider.

If the load or parasitic capacitance is Cload and the isolation capacitance is Ciso, then the gain between input and output can be calculated as:

$$Vout/vin=(Ciso)/(Ciso+Cload)$$

which will be nearly unity (i.e., 1) when Ciso>>Cload. In addition, if Ciso>>Cload, the gain will also be largely insensitive to variations in Ciso and Cload. For example, if Cin is 100 ppm of Ciso, then a 10% variation in Ciso or Cload results in only a 10 ppm variation in the voltage gain.

In an alternative embodiment, Ciso could be well matched to Cload to create a capacitive voltage divider. However, in such an embodiment, the isolation capacitance Ciso should be matched to load capacitance Cload with fluctuations in temperature and other conditions.

DETAILED DESCRIPTION OF THE INVENTION

Figure 1:
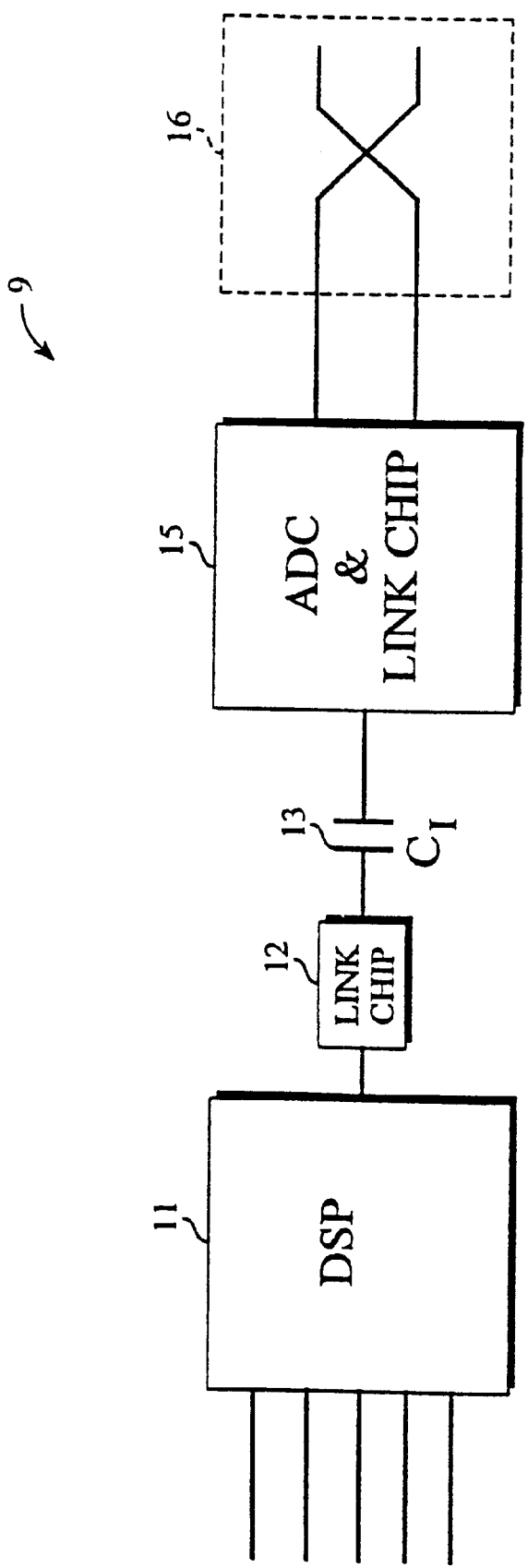
FIG. 1 is a block diagram of a measurement system of the Prior Art.
Figure 2:
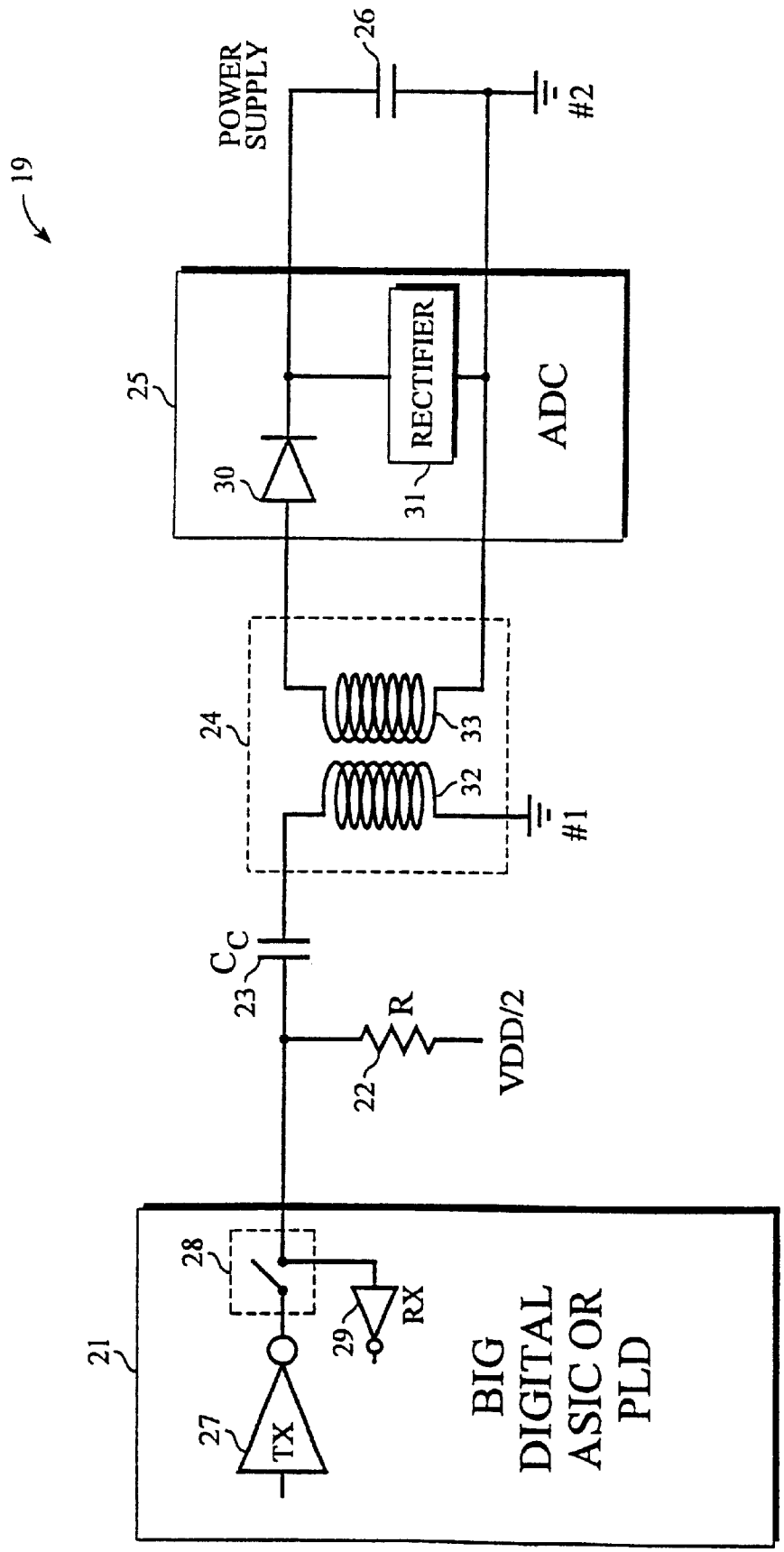
FIG. 2 is a block diagram of another embodiment of a measurement system 19 of the Prior Art.
Figure 3:
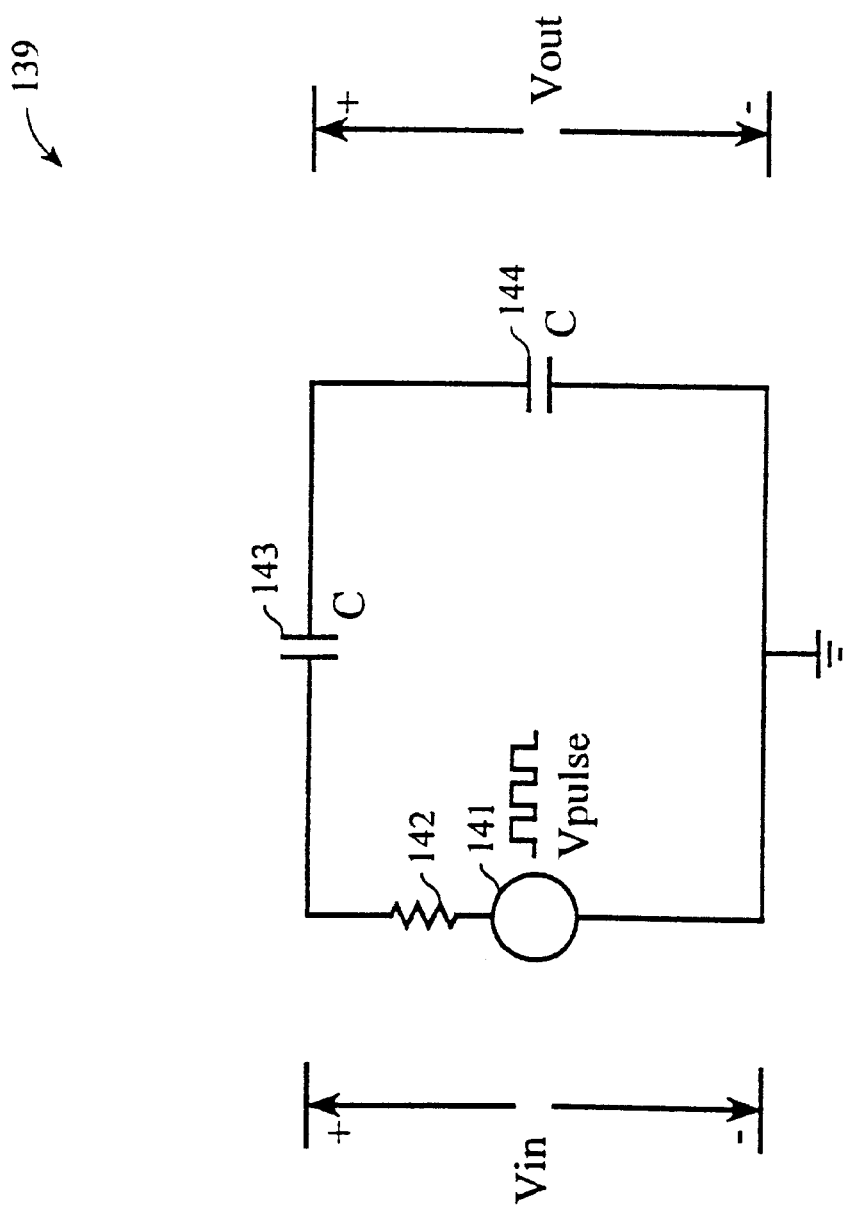
FIG. 3 is a block diagram of an isolated analog-to-digital converter system of the present invention.

FIG. 3 is a simplified schematic of the capacitive isolation system 139 of the present invention as coupled to an analog-to-digital converter (ADC) and reference source. Various components within the simplified diagram of FIG. 3 may reside within the ADC, the reference source, or as part of the isolation circuit. For the sake of illustration in this simplified diagram, all components are illustrated as part of one circuit.

Capacitance Cload 144 represents the load capacitance of an ADC. Voltage Vout across capacitance Cload 144 represents the output voltage on the non-isolated (ADC) side of isolation circuit 139 whereas voltage Vin across resistor 142 and signal source 141 represents the input voltage on the microprocessor (isolated) side of isolation circuit 139. Isolation capacitor Ciso 143 acts as an isolation barrier between the isolated and non-isolated sides of isolation circuit 139.

Signal generator 141 generates a square waveform Vpulse which has a lower logic level at ground and an upper logic level at a reference power supply signal (e.g., 2.5 Volts or the like). Signal Vpulse therefore acts as an accurate reference voltage signal. If isolation capacitor Ciso 143 is set much larger than voltage parasitic capacitance Cload 144, (e.g., parasitic capacitance Cload 144 is on the order of picoFarads and isolation capacitor Ciso 143 is on the order of microFarads), output voltage Vout will be substantially equal to input voltage Vin.

Thus, a capacitively coupled reference voltage and a capacitively coupled gain calibration is provided by the apparatus of FIG. 3. The gain between input and output can be calculated as:

$$Vout/Vin=(Ciso)/(Ciso+Cload)$$

which will be nearly unity (i.e., 1) when Ciso>>Cload. In addition, if Ciso>>Cload, the gain will also be largely insensitive to variations in Ciso and Cload. For example, if Cin is 100 ppm of Ciso, then a 10% variation in Ciso or Cload results in only a 10 ppm variation in the voltage gain.

Figure 4:
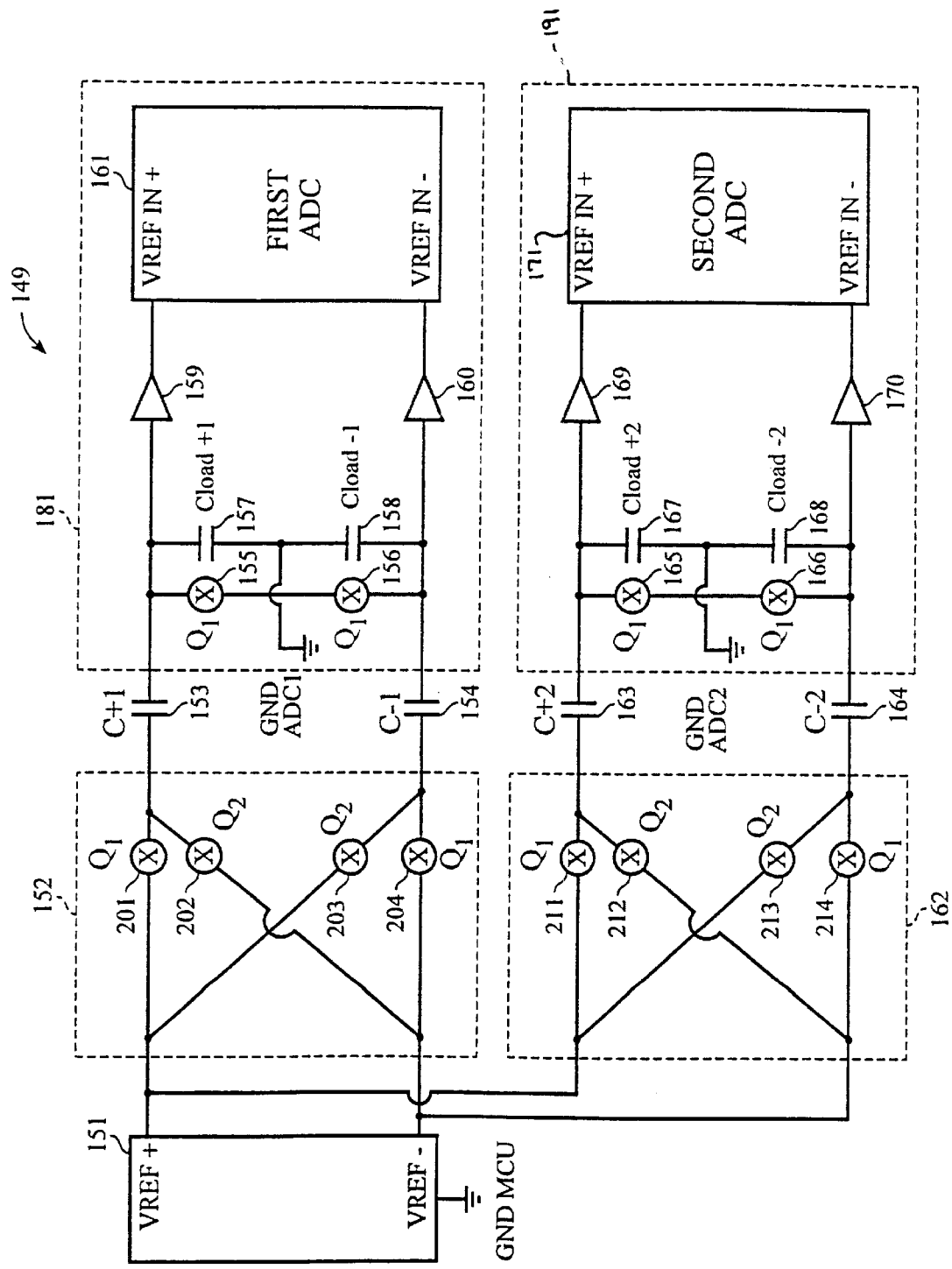
FIG. 4 is a block diagram of a capacitively coupled reference system incorporating the apparatus of FIG. 3.

FIG. 4 illustrates a scheme of capacitively coupled reference system 149 with two isolated ADCs 161 and 171. Four isolation capacitors 153, 154, 163, and 164 are illustrated coupling ADCs 161 and 171 to switching systems 152 and 162 which may reside, along with reference source 151 within, for example, a microcontroller or microcontrollers. Reference source 151 may be coupled to reference source ground to provide first and second reference voltages VREF+ and VREF−. The output of (bandgap) reference source 151 may be AC coupled through isolation capacitors 153, 154, 163, and 164 to ADC systems 181 and 191.

Capacitors Cload+1 157 and Cload−1 158 are the load capacitors seen by respective isolation capacitors Ciso+1 153 and Ciso−1 154. Similarly, capacitors Cload+2 167 and Cload−2 168 are the load capacitors seen by respective isolation capacitors Ciso+2 163 and Ciso−2 164. Buffers 159, 160, 169, and 170 represent the loading effects of the ADC systems 181 and 191 as modeled by the load capacitors.

First and second switching systems 152 and 162 may each have first through fourth switches respectively Q1 through Q4. First switching system 152 may be provided with switches Q1 201, Q2 202, Q2 203, and Q1 204. Second switching system 162 may be provided with switches Q1 211, Q2 212, Q2 213, and Q1 214.

Switches Q1 201, Q1 204, Q1 211, and Q1 214 all open and close at substantially the same time. Similarly, switches Q2 202, Q2 203, Q2 212, and Q2 213 all open and close at substantially the same time. Load capacitances Cload+1 157 and Cload−1 158 may be coupled to one another through a common node which in turn may be coupled to ground ADC1. Load capacitances Cload+1 167 and Cload−1 168 may be coupled to one another through a common node which in turn may be coupled to ground ADC2.

Each of the first and second ADCs 161 and 171 may have respective first and second reference inputs VREFIN+ and VREFIN−. Reference source 151 may be coupled to the first and second switching systems 152 and 162 which in turn may be coupled to first through fourth isolation capacitors 153, 154, 163, and 164.

Isolation capacitor 153 may be coupled to switch Q1 155, load capacitance Cload+1 157 and buffer 159. Isolation capacitor 154 may be coupled to switch Q1 156, load capacitance Cload−1 158 and buffer 160. Isolation capacitor 163 may be coupled to switch Q1 165, load capacitance Cload+2 167 and buffer 169. Isolation capacitor 164 may be coupled to switch Q1 166, load capacitance Cload−2 157 and buffer 170.

The components to the left of isolation capacitors 153, 154, 163, and 164, as illustrated in FIG. 4, may be fabricated on a unitary chip including a reference source. The components to the right side of isolation capacitors 153 and 154 may be fabricated on a single unitary semiconductor as the first ADC system 181. The components to the right side of isolation capacitors 163 and 164 may be fabricated on a single unitary semiconductor as the second ADC system 191.

Buffers 159 and 160 represent the loading effect of ADC 181 as modeled by the load capacitors, with non-overlapping clocks. Clock signals on the ADC side may be derived from the reference source through a separate isolation channel (not shown). First ADC 161, second ADC 171 and the reference source are may be references to grounds GND ADC1, GND ADC2 and GND SOURCE, respectively. In operation, these grounds may be allowed to change in absolute voltage relative to one another, provided the change in ground levels is slower than that of the non-overlapping clocks.

When the ratio of the isolation capacitor to the load capacitor is large enough, the reference voltage seen by ADCs 161 and 171 maintains a ratio very close to 1 with high precision. Once the ratio is determined during factory calibration, it remains highly stable as it is sensitive to variations in the isolation capacitor(s). In the preferred embodiment of the present invention, only the isolation capacitor(s) are external components of the overall device.

While the preferred embodiment and various alternative embodiments of the invention have been disclosed and described in detail herein, it may be apparent to those skilled in the art that various changes in form and detail may be made therein without is departing from the spirit and scope thereof.

We claim:

1. An isolated analog-to-digital converter system comprising:

at least one analog-to-digital converter subsystem including an analog-to-digital converter for converting an analog signal to a digital data stream, the at least one analog-to-digital converter subsystem having a load capacitance defined as Cload;

a reference voltage subsystem for providing at least one reference voltage signal for the analog-to-digital converter; and an isolation subsystem for electrically isolating the at least one analog-to-digital converter subsystem from the reference voltage subsystem, the isolation subsystem comprising:

a capacitive divider having an isolation capacitance Ciso, wherein gain between input and output is calculated as Vout/Vin=(Ciso)/(Ciso+Cload).

2. The isolated analog-to-digital converter system of claim 1 wherein said capacitive divider comprises a near unity gain capacitive divider having an isolation capacitance Ciso, where Ciso>>Cload, wherein gain between input and output is calculated as Vout/Vin=(Ciso)/(Ciso+Cload), which is nearly unity when Ciso>>Cload.

3. The isolated analog-to-digital converter system of claim 2, wherein gain between input and output is substantially insensitive to variations in Cisio and Cload when Ciso>>Cload.

4. The isolated analog-to-digital converter system of claim 1, wherein said reference voltage subsystem comprises a first voltage reference for providing a first reference voltage signal VREF+ for the at least one analog-to-digital converter subsystem, and a second voltage reference for providing a second reference voltage signal VREF− for the at least one analog-to-digital converter subsystem, wherein said at least one analog-to-digital converter subsystem comprises a first analog-to-digital converter subsystem having load capacitances defined as Cload+1 and Cload−1, and wherein said isolation subsystem comprises a first near unity gain capacitive divider having isolation capacitances Ciso+1 and Ciso+1 and, where Ciso+1>>Cload+1, Ciso−1>>Cload−1, wherein gain between input reference voltage signals and output reference voltage signals is calculated as VREF+out/VREF+in=(Ciso+1)/(Ciso+1+Cload+1), which is nearly unity when Ciso+1>>Cload+1 and VREF-out/VREF-in=(Ciso−1)/(Ciso−1+Cload−1), which is nearly unity when Ciso−1>>Cload−1.

5. The isolated analog-to-digital converter system of claim 4, wherein said at least one analog-to-digital converter subsystem further comprises a second analog-to-digital converter subsystem having load capacitances defined as Cload+2 and Cload−2, and wherein said isolation subsystem further comprises a first near unity gain capacitive divider having isolation capacitances Ciso+2 and Ciso+2 and, where Ciso+2>>Cload+2, Ciso−2>>Cload−2, wherein gain between input reference voltage signals and output reference voltage signals is calculated as VREF+out/VREF+in=(Ciso+2)/(Ciso+2+Cload+2), which is nearly unity when Ciso+2 >>Cload+2 and VREF-out/VREF-in=(Ciso−2)/(Ciso−2+Cload−2), which is nearly unity when Ciso−2>>Cload−2.

6. The isolated analog-to-digital converter system of claim 5, further comprising:

a first switching means coupled to said reference voltage subsystem and to said first analog-to-digital converter subsystem, for switching reference voltage signals VREF+ and VREF− to inputs of the first analog to digital converter subsystem; and a second switching means coupled to said reference voltage subsystem and to said second analog-to-digital converter subsystem, for switching reference voltage signals VREF+ and VREF− to inputs of the second analog to digital converter subsystem.

7. The isolated analog-to-digital converter system of claim 4, further comprising:

a first switching means coupled to said reference voltage subsystem and to said first analog-to-digital converter subsystem, for switching reference voltage signals VREF+ and VREF− to inputs of the first analog to digital converter subsystem.

8. A method for isolating an analog-to-digital converter comprising the steps of:

in at least one analog-to-digital converter subsystem including an analog-to-digital converter, converting an analog signal to a digital data stream, the at least one analog-to-digital converter subsystem having a load capacitance defined as Cload, in a reference voltage subsystem, providing at least one reference voltage signal for the analog-to-digital converter, and in an isolation subsystem, electrically isolating the at least one analog-to-digital converter subsystem from the reference voltage subsystem, said step of electrically isolating further comprising the step of:

isolating the reference voltage subsystem from the at least one analog-to-digital converter subsystem using a capacitive divider having an isolation capacitance Ciso, wherein gain between input and output is calculated as Vout/Vin=(Ciso)/(Ciso+Cload).

9. The method of claim 8, wherein said step of isolating the reference voltage subsystem from the at least one analog-to-digital converter subsystem using a capacitive divider comprises the step of isolating the reference voltage subsystem from the at least one analog-to-digital converter subsystem using a near unity gain capacitive divider having an isolation capacitance Ciso, where Ciso>>Cload, wherein gain between input and output is calculated as Vout/Vin= (Ciso)/(Ciso+Cload), which is nearly unity when Ciso>>Cload.

10. The method of isolating an analog-to-digital converter system of claim 9, wherein gain between input and output is largely intensive to variations to Ciso and Cload when Ciso>>Cload.

11. The method of isolating an analog-to-digital converter system of claim 9, wherein said step of providing at least one reference voltage signal comprises the step of providing a first voltage reference voltage signal VREF+ for the at least one analog-to-digital converter subsystem, and a second voltage reference signal VREF− for the at least one analog-to-digital converter subsystem, wherein the at least one analog-to-digital converter subsystem comprises a first analog-to-digital converter subsystem having load capacitances defined as Cload+1 and Cload−1, and wherein said step of electrically isolating comprises the step of isolating the reference voltage subsystem from the first analog-to-digital converter subsystem using a first near unity gain capacitive divider having isolation capacitances Ciso+1 and Ciso+1 and, where Ciso+1>>Cload+1, Ciso−1>>Cload−1, wherein gain between input reference voltage signals and output reference voltage signals is calculated as VREF+out/VREF+in=(Ciso+1)/(Ciso+1+Cload+1), which is nearly unity when Ciso+1>>Cload+1 and VREF-out/VREF-in=(Ciso−1)/(Ciso−1+Cload−1), which is nearly unity when Ciso−1>>Cload−1.

12. The method of isolating an analog-to-digital converter system of claim 11, wherein the at least one analog-to-digital converter subsystem further comprises a second analog-to-digital converter subsystem having load capacitances defined as Cload+2 and Cload−2, and wherein said step of electrically isolating comprises the step of isolating the reference voltage subsystem from the second analog-to-digital converter subsystem using a second near unity gain capacitive divider having isolation capacitances Ciso+2 and Ciso+2 and, where Ciso+2>>Cload+2, Ciso−2>>Cload−2, wherein gain between input reference voltage signals and output reference voltage signals is calculated as VREF+out/VREF+in=(Ciso+2)/(Ciso+2+Cload+2), which is nearly unity when Ciso+2>>Cload+2 and VREF-out/VREF-in=(Ciso−2)/(Ciso−2+Cload−2), which is nearly unity when Ciso−2>>Cload−2.

13. The method of isolating an analog-to-digital converter system of claim 12, further comprising the step of:

switching, in a first switching means coupled to said reference voltage subsystem and to said first analog-to-digital converter subsystem, reference voltage signals VREF+ and VREF− to inputs of the first analog to digital converter subsystem.

14. The method of isolating an analog-to-digital converter system of claim 13, further comprising the steps of:

switching, in a first switching means coupled to said reference voltage subsystem and to said first analog-to-digital converter subsystem, reference voltage signals VREF+ and VREF− to inputs of the first analog to digital converter subsystem, and switching, in a second switching means coupled to said reference voltage subsystem and to said second analog-to-digital converter subsystem, reference voltage signals VREF+ and VREF− to inputs of the second analog to digital converter subsystem.

* * * * *